(12) United States Patent
Wang et al.

(10) Patent No.: US 10,360,866 B2
(45) Date of Patent: Jul. 23, 2019

(54) GOA CIRCUIT AND LIQUID CRYSTAL DISPLAY DEVICE

(71) Applicant: Shenzhen China Star Optoelectronics Semiconductor Display Technology Co., Ltd., Shenzhen (CN)

(72) Inventors: Tianhong Wang, Shenzhen (CN); Shujhih Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/578,245

(22) PCT Filed: Sep. 15, 2017

(86) PCT No.: PCT/CN2017/101975
§ 371 (c)(1),
(2) Date: Nov. 30, 2017

(87) PCT Pub. No.: WO2019/033493
PCT Pub. Date: Feb. 21, 2019

(65) Prior Publication Data
US 2019/0051263 A1  Feb. 14, 2019

(30) Foreign Application Priority Data
Aug. 14, 2017 (CN) .......................... 2017 1 0693610

(51) Int. Cl.
*G09G 3/36* (2006.01)

(52) U.S. Cl.
CPC ....... *G09G 3/3677* (2013.01); *G09G 2310/06* (2013.01); *G09G 2310/08* (2013.01)

(58) Field of Classification Search
None
See application file for complete search history.

(56) References Cited

U.S. PATENT DOCUMENTS

2016/0248417 A1\* 8/2016 Xiao ..................... G09G 3/3677
2017/0047031 A1\* 2/2017 Cao .................... G02F 1/136286

\* cited by examiner

Primary Examiner — Gustavo Polo
(74) Attorney, Agent, or Firm — Leong C. Lei

(57) ABSTRACT

The present invention involves a GOA circuit and a liquid crystal display. The GOA circuit comprises an N-th stage GOA unit, which comprises a pull-high control circuit, a pull-high circuit, a pull-down circuit, a pull-down sustain circuit, and a boast capacitor (Cb). A first clock signal CK(N) is inputted to the pull-high circuit. The pull-high control circuit comprises: A first thin film transistor (T11), whose gate electrode is connected with a stage-transfer signal output terminal of the (N−m)th stage GOA unit, whose source electrode and drain electrode are respectively connected with a gate electrode of a second thin film transistor (T12) and inputted with a second clock signal (XCK(N)). A source electrode and a drain electrode of the second thin film transistor (T12) are respectively connected with the stage-transfer signal output terminal of the (N−m)th stage GOA unit and the node (Q(N)) of the N-th stage GOA unit. The present invention also provides a corresponding liquid crystal display device. The GOA circuit and the liquid crystal display device of the present invention can make the output waveform of the node Q of each GOA unit be consistent.

14 Claims, 4 Drawing Sheets

GOA CIRCUIT AND LIQUID CRYSTAL DISPLAY DEVICE

BACKGROUND OF THE INVENTION

Field of Invention

The present invention relates to the field of liquid crystal display, and more particularly to a GOA circuit and a liquid crystal display device.

Description of Prior Art

Liquid crystal displays (LCDs) such as flat panel display devices are widely used in mobile phones, televisions, personal digital assistants, digital cameras, notebooks, desktop, other consumer electronics products and etc. for high quality, power saving, thin body and wide application range. The LCDs has become the mainstream in display device.

In the active LCD, each sub-pixel has a thin film transistor (TFT) whose gate electrode is connected with a horizontal scanning line, a drain electrode is connected with a data line in the vertical direction, and a source electrode is connected with a pixel electrode. Applying a sufficient voltage on the horizontal scanning line, all the TFTs on the horizontal scanning line are opened, where the pixel electrodes on the horizontal scanning line will be conducted with the data lines in the vertical direction, the display-signal voltage on the data line is written onto the pixels, to control the transparency of different liquid crystal for achieving the effect of color control. At present, the driving of the horizontal scanning line of the active LCD panel is mainly realized by an external chip (IC) of the panel. The external IC can control the charging and discharging of each stage horizontal scanning line from stage to stage. Gate on Array, GOA technology, the gate driver on array technology, which use the conventional process of the LCD panel to produce the row scanning driving circuit of gate electrodes on the substrate so that it can complete the row-by-row scanning to the gate electrodes.

The conventional GOA circuits typically include cascaded multiple GOA units, each stage GOA unit corresponds to drive a horizontal scanning line. The main structure of the GOA unit includes a pull-high circuit, a pull-high control circuit, a pull-down circuit, a pull-down sustain circuit, and a boast capacitor for the potential elevation. The pull-high control circuit can be called as a pre-charging circuit. The pull-high circuit is mainly responsible for outputting the clock signal as a gate signal. The pull-high control circuit is responsible for controlling the opening time of the pull-high circuit. Generally, the pull-high control circuit is connected with a previous stage GOA circuit to receive a stage-transfer signal or the gate signal. The pull-down circuit is responsible for pulling the gate signal low to a low potential at the first moment, that is, the gate signal is turned off. The pull-down sustain circuit is responsible for maintaining the gate output signal and the gate signal of the pull-high circuit (commonly referred to as Q point) in a closed state (i.e., negative potential). The boast capacitor is responsible for a second potential elevation of the Q point, which is beneficial to the output G(N) of the pull-high circuit.

Because GOA technology can save the gate chip (gate IC), to achieve a narrow border and other advantages, the current GOA technology has been widely used in panel design, so that the design of the new GOA circuit is necessary. However, in the case where the start signal STV is currently used as the GOA ON signal and the Q-point pre-charging signal, the waveforms of the waveforms of the Q point belong to the on the first list of stages may be inconsistent due to the difference in the pre-charging time.

Please refer to FIG. 1, the conventional GOA circuit structure is shown, the GOA circuit structure is mainly constituted by the pull-high control circuit T11, the pull-high circuit (including T21, T22), the pull-down circuit, the pull-down sustain circuit, and a boast capacitor Cb and so on. To the N-th stage GOA unit, the pull-high control unit is connected with a stage-transfer signal output terminal ST(N−4) and a gate signal output terminal G (N−4) of a (N−4)th stage GOA unit and responsible for controlling the opening time of the pull-up circuit and pre-charging the node Q (N). The pull-high unit is connected with a clock signal CK and a stage-transfer signal output terminal ST(N) of the (N)th stage GOA unit, and is responsible for outputting the clock signal CK to corresponding horizontal scanning lines through a gate signal output terminal G(N) of the N-th stage and outputting the stage-transfer signal of the N-th stage GOA unit. The pull-down unit is responsible for pulling down the gate signal output terminal G(N) of the N-th stage. The pull-down sustain unit may be used to keep to pull down the voltage of the gate signal output terminal G(N) and the voltage of the node Q (N) of the pull-high unit, so that the gate signal outputted from the gate signal output terminal G (N) is maintained in the OFF state.

Please refer to FIGS. 2 and 3; FIG. 2 is an illustrative diagram of the output signal of the node Q of the GOA circuit structure according to the conventional art, the horizontal axis for the time, the vertical axis for the voltage. It shows the waveforms of 1st to 8th stage GOA units. FIG. 3 is an illustrative diagram of the input signal of the CK and the input signal of the STV of the GOA circuit structure according to the conventional art, the horizontal axis for the time, and the vertical axis for the voltage. It shows the start signal STV and the high-frequency clock signal CK inputted to 1-6 stage GOA units, it can be seen in FIG. 3 that the high-frequency clock signal CK of all stage of GOA units are the normal CK output waveform, CK waveform are generated order-by-order, there is no relative advance output. Since the pull-up control circuit needs to input the stage-level signal and the gate signal of the (N−4)th stage GOA unit, the preceding stages of the GOA circuit needs to be inputted with the start signal STV instead of the stage-transfer signal as the ON signal of the GOA and the pre-charging signal of the node Q, resulting that the output waveforms of the first three nodes Q are not consistent with a normal level node Q(see FIG. 2).

SUMMARY OF THE INVENTION

Therefore, an object of the present invention is to provide a GOA circuit that makes the outputted waveforms of the node Q of each stage GOA unit of the GOA circuit be consistent.

Another object of the present invention is to provide a liquid crystal display device that makes the outputted waveforms of the node Q of each stage GOA unit of the GOA circuit be consistent.

In order to achieve the object, the present invention provides a GOA circuit, which comprises a plurality of cascaded GOA units. An N-th stage GOA unit controls charging of an N-th horizontal scanning line. The N-th stage GOA unit comprises a pull-high control circuit, a pull-high circuit, a pull-down circuit, a pull-down sustain circuit, and a boast capacitor. The pull-high circuit, the pull-down sustain circuit and the boast capacitor are respectively connected with a node and a gate signal output terminal of the N-th stage GOA circuit. A first clock signal of the N-th stage GOA unit is inputted to the pull-high circuit. A stage-transfer signal output terminal of the N-th stage GOA unit is connected with the pull-high circuit and the pull-down circuit is respectively connected with the node of the N-th stage GOA circuit. The pull-high control circuit comprises:

A first thin film transistor. A gate electrode of first thin film transistor is connected with a stage-transfer signal output terminal of the (N−m)th stage GOA unit. m is a natural number. A source electrode and a drain electrode of first thin film transistor are respectively connected with a gate electrode of a second thin film transistor and inputted with a second clock signal of the N-th stage GOA unit.

A source electrode and a drain electrode of the second thin film transistor are respectively connected with the stage-transfer signal output terminal of the (N−m)th stage GOA unit and the node of the N-th stage GOA unit.

A start signal is inputted to the stage-transfer signal output terminal of the (N−m)th stage GOA unit of preceding m-th GOA unit.

The gate electrode of first thin film transistor is connected with a stage-transfer signal output terminal of the (N−4)th stage GOA unit. The source electrode and the drain electrode of the second thin film transistor are respectively connected with the stage-transfer signal output terminal of the (N−4)th stage GOA unit and the node of the N-th stage GOA unit.

A start signal is inputted to the stage-transfer signal output terminal of the (N−4)th stage GOA unit of preceding 4 stage GOA units.

The GOA circuit comprises eight first clock signals with the same waveform and different initial phases.

The initial phases of each adjacent two of the eight first clock signals are arranged with an equivalent phase difference of $\frac{1}{4}\pi$.

The GOA circuit comprises two or at least two first clock signals with the same waveform and different initial phases.

The GOA circuit is manufactured based on amorphous silicon thin film transistor fabrication.

The pull-high circuit comprises:

A third thin film transistor. A gate electrode is connected with the node of the N-th stage GOA unit. A source electrode and a drain electrode are respectively connected with the gate signal output terminal of the N-th stage GOA unit and inputted with the first clock signal.

A fourth thin film transistor. A gate electrode is connected with the node of the N-th order GOA unit. A source electrode and a drain electrode are respectively connected with the stage-transfer signal output terminal of the N-th stage GOA unit and inputted with the first clock signal.

The present invention further provides a liquid crystal device which comprises the above GOA circuit.

The present invention further provides a GOA circuit, which comprises a plurality of cascaded GOA units. An N-th stage GOA unit controls charging of an N-th horizontal scanning line. The N-th stage GOA unit comprises a pull-high control circuit, a pull-high circuit, a pull-down circuit, a pull-down sustain circuit, and a boast capacitor. The pull-high circuit, the pull-down sustain circuit and the boast capacitor are respectively connected with a node and a gate signal output terminal of the N-th stage GOA circuit. A first clock signal of the N-th stage GOA unit is inputted to the pull-high circuit. A stage-transfer signal output terminal of the N-th stage GOA unit is connected with the pull-high circuit and the pull-down circuit is respectively connected with the node of the N-th stage GOA circuit. The pull-high control circuit comprises:

A first thin film transistor. A gate electrode of first thin film transistor is connected with a stage-transfer signal output terminal of the (N−m)th stage GOA unit. m is a natural number. A source electrode and a drain electrode of first thin film transistor are respectively connected with a gate electrode of a second thin film transistor and inputted with a second clock signal of the N-th stage GOA unit.

A source electrode and a drain electrode of the second thin film transistor are respectively connected with the stage-transfer signal output terminal of the (N−m)th stage GOA unit and the node of the N-th stage GOA unit.

A start signal is inputted to the stage-transfer signal output terminal of the (N−m)th stage GOA unit of preceding m-th GOA unit.

The GOA circuit comprises two or at least two first clock signals with the same waveform and different initial phases.

The GOA circuit is manufactured based on amorphous silicon thin film transistor fabrication.

The pull-high circuit comprises:

A third thin film transistor. A gate electrode is connected with the node of the N-th stage GOA unit. A source electrode and a drain electrode are respectively connected with the gate signal output terminal of the N-th stage GOA unit and inputted with the first clock signal.

A fourth thin film transistor. A gate electrode is connected with the node of the N-th order GOA unit. A source electrode and a drain electrode are respectively connected with the stage-transfer signal output terminal of the N-th stage GOA unit and inputted with the first clock signal.

In summary, the GOA circuit and the liquid crystal display device of the present invention can enhance the performance of the node Q at each GOA unit, to make the outputted waveforms of the node Q of each stage GOA unit of the GOA circuit be consistent.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 1:
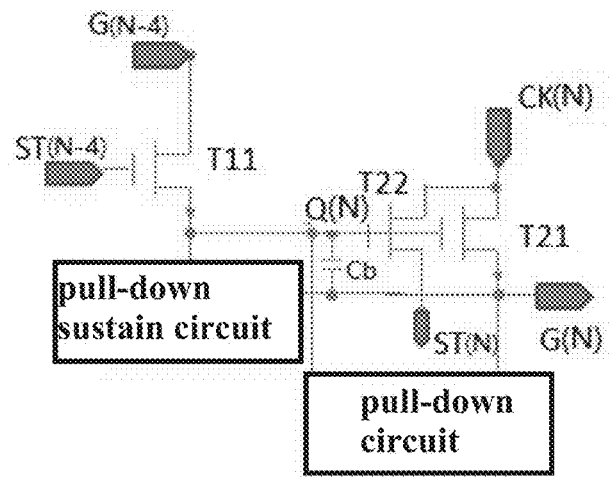
FIG. 1 is an illustrative diagram of an ordinary GOA circuit structure according to the conventional art.
Figure 2:
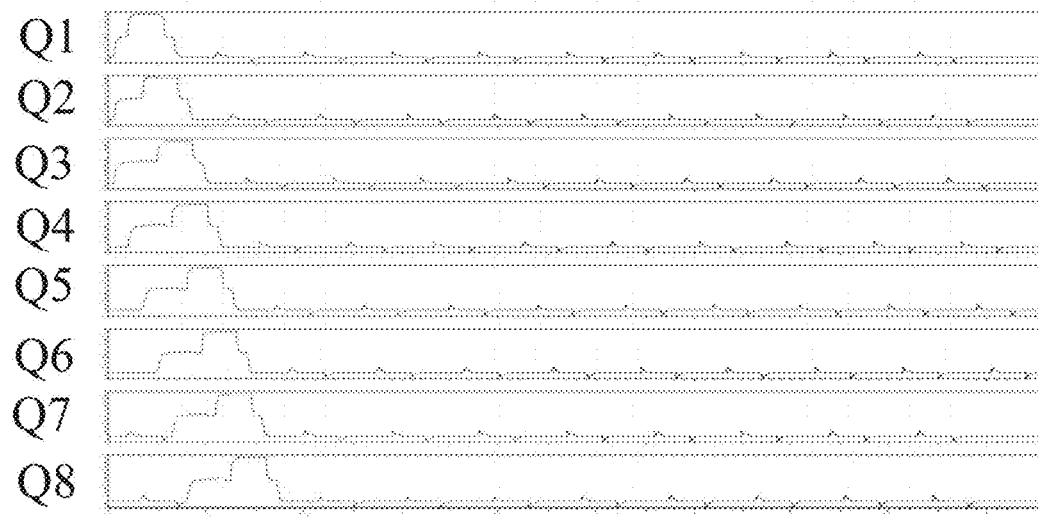
FIG. 2 is an illustrative diagram of the output signal of the node Q of the circuit structure according to the conventional art.
Figure 3:
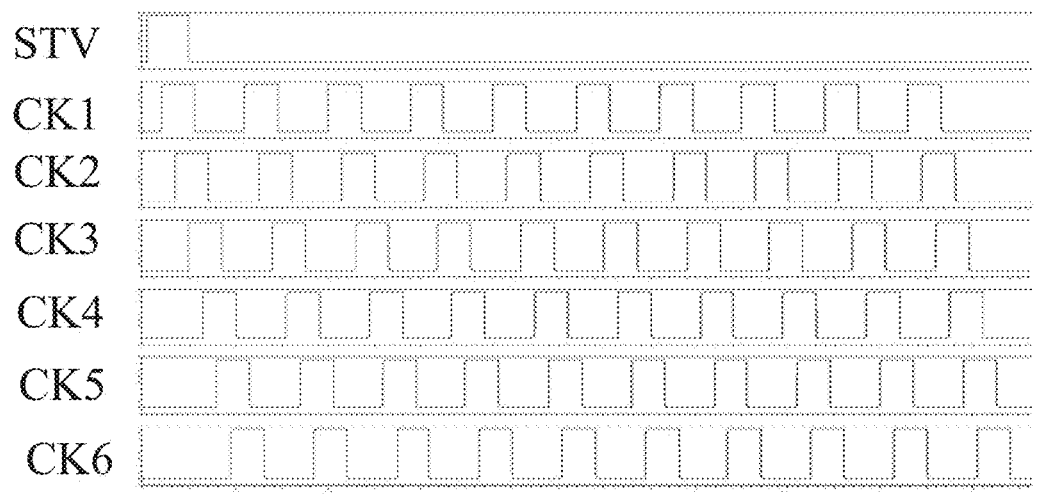
FIG. 3 is an illustrative diagram of waveforms of the input signal of CK and the input signal of STV of the circuit structure according to the conventional art.
Figure 4:
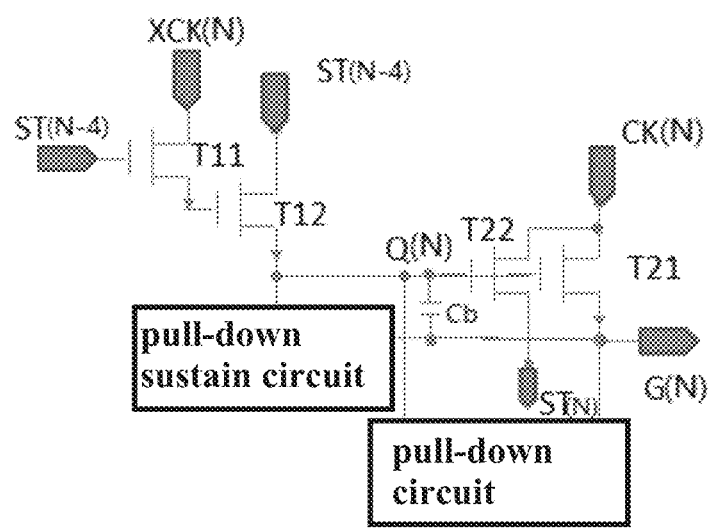
FIG. 4 is an illustrative diagram of a GOA circuit structure of a preferred embodiment according to the present invention.

Please refer to FIG. 4, which is an illustrative diagram of a GOA circuit structure of a preferred embodiment according to the present invention. The GOA circuit structure is mainly constituted by the pull-high control circuit T11, the pull-high circuit (including T21, T22), the pull-down circuit, the pull-down sustain circuit, and a boast capacitor Cb and so on.

To the N-th stage GOA unit, the pull-high control circuit is responsible for controlling the opening time of the pull-high circuit and pre-charging the node Q (N). The pull-up circuit is connected with a high-frequency clock signal CK (N) and stage-transfer signal output terminal of the N-th stage GOA unit (N) for outputting the clock signal CK (N) to the corresponding horizontal scanning line through the gate signal output terminal G (N) of the N-th stage and outputting the stage-transfer signal of the N-th stage GOA unit. The pull-down circuit is responsible for pulling down the potential of the gate signal output terminal G (N) at the N-th stage. The pull-down sustain circuit is used to maintain to pull down the potential of the gate signal output terminal G (N) of the N-th stage and the potential of the node Q(N) of the pull-high circuit, so that the gate signal outputted from the gate signal output terminal G (N) is maintained in the OFF state. The bootstrap capacitor Cb is responsible for the secondary lift of the node Q (N), which facilitates the output of the pull-up circuit.

In one preferred embodiment, the gate electrode of thin film transistor T11 is connected with a stage-transfer signal output terminal ST(N−4) of the (N−4)th stage GOA unit. The source electrode and the drain electrode of the thin film transistor T12 are respectively connected with the stage-transfer signal output terminal ST(N−4) of the (N−4)th stage GOA unit and the node Q(N) of the N-th stage GOA unit. It is needed to provide a start signal STV inputted to the stage-transfer signal output terminal ST(N−4) of the (N−4)th stage GOA unit of preceding 4 stage GOA units, to open the entire GOA circuit and the start signal STV is serve as a pre-charging signal of the node Q (N).

The structure of the pull-high control circuit shown in FIG. 4 is only for the purpose of illustrating the invention. The invention changes the pull-high circuit by adding a TFT named T12, so that the output waveforms of the node Q (N) of each stage GOA unit be consistent, to avoid the voltage for driving T21 is inconsistent. The present invention only adds a thin film transistor T12 on the basis of the existing GOA circuit; the original input signal STV needs no change; the changed pull-high control circuit generally comprises a thin film transistor T11. A gate electrode of the thin film transistor T11 is connected with a stage-transfer signal output terminal of the (N−m)th stage GOA unit, m is a natural number (FIG. 4 shows a circuit structure when m=4). A source electrode and a drain electrode of the thin film transistor T11 are respectively connected with a gate electrode of the thin film transistor T12 and inputted with a clock signal XCK (N), and the clock signal XCK (N) is opposite to the clock signal CK (N); the source electrode and drain electrode of the thin film transistor T12 are respectively connected with the stage transfer signal output terminal of the (N−m)th stage GOA unit and the node Q(N) of the N-th stage GOA unit. Within the first m grades GOA unit(s), the start signal STV is inputted to the a stage-transfer output signal output terminal of the (N−m)th stage GOA unit of the first m grades GOA unit(s).

In the preferred embodiment shown in FIG. 4, the pull-high circuit specifically comprises a thin film transistor T21 whose gate electrode is connected with the node Q (N), a source electrode and a drain electrode are respectively connected with the gate signal output terminals G(N) and inputted with the clock signal CK (N), respectively; a thin film transistor T22 whose gate electrode is connected with the node Q(N), a source electrode and a drain electrode are respectively connected with the stage-transfer signal output terminal ST(N) of the N-th stage GOA unit and inputted with the clock signal CK(N).

Figure 5:
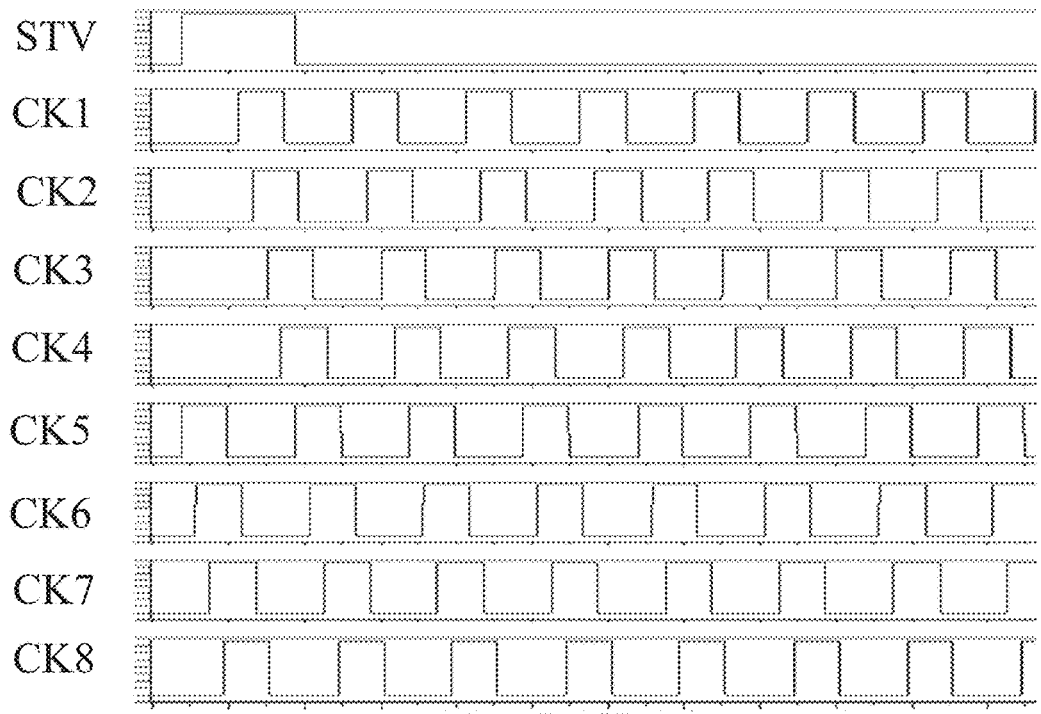
FIG. 5 is an illustrative diagram of waveforms of the input signal of CK and the input signal of STV of the circuit structure according to one preferred embodiment of the present invention.

Please refer to FIG. 5, which is an illustrative diagram of waveforms of the input signal of CK and the input signal of STV of the circuit structure according to one preferred embodiment of the present invention. The horizontal axis is the time and the vertical axis is the voltage. In the preferred embodiment, the GOA circuit comprises eight first clock signals CK(N), in particular CK1 to CK8, which have the same waveform and have different initial phases, and the initial phases of each adjacent two of CK1 to CK8 are arranged with an equal difference of π4. For large-size and high-resolution panels, generally use a plurality of high-frequency clock signal for driving, each GOA unit corresponds to one of the clock signals. See FIG. 5, if there are 8 clock signals, the CK5 (XCK1)~CK8 (XCK4), the four clock signals are turned in advance when the STV is turned on; the falling edge of the STV signal corresponds to the rising edge of the CK5 (XCK1).

Generally, the GOA circuit of the present invention comprises two or more clock signals CK (N) having the same waveform and different initial phases, and the GOA circuit is manufactured based on amorphous silicon thin film transistor fabrication. The invention provides a new design scheme of the GOA circuit. The invention provides a new design scheme of the GOA circuit. The invention can be applied to all the amorphous silicon (a-si) GOA circuit, whose number of the clock signal is larger or equal to 2, by adding a TFT on the foundation of the original GOA circuit, to make the output waveforms of the node Q of all the stages be consistent. The GOA circuit of the present invention can be applied to a corresponding liquid crystal display device.

Figure 6:
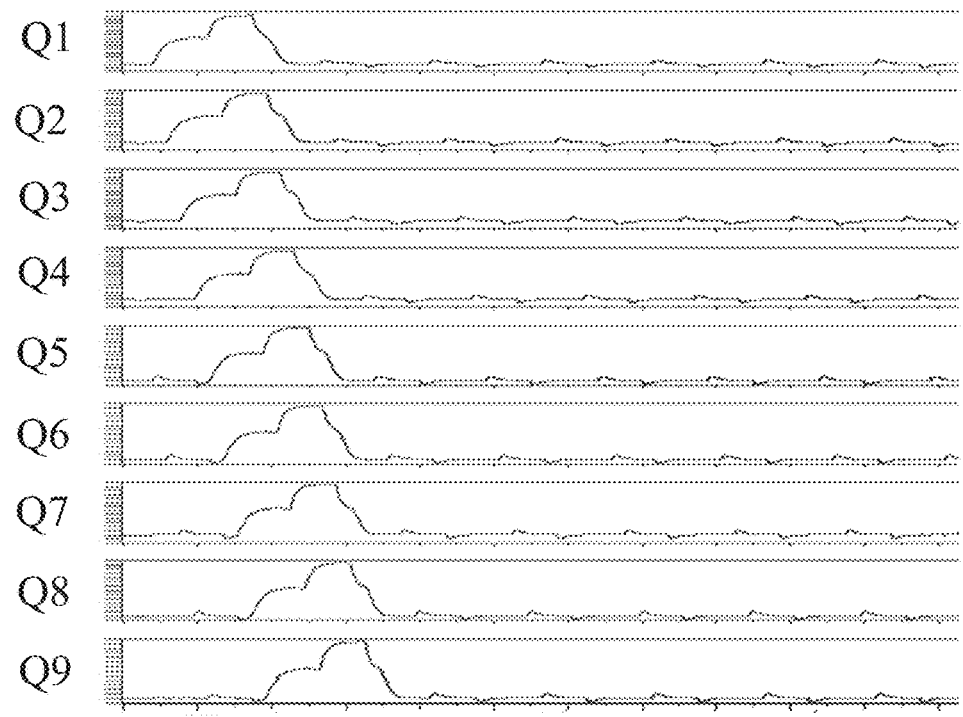
FIG. 6 is an illustrative diagram of the output signal of the node Q of the circuit structure according to one preferred embodiment of the present invention.

FIG. 6 is an illustrative diagram of the output signal of the node Q of the circuit structure according to one preferred embodiment of the present invention. The horizontal axis is the time and the vertical axis is the voltage. It can be seen that the output waveform of the first three nodes Q are consistent with the output of the normal node Q.

In summary, the GOA circuit and the liquid crystal display device of the present invention can enhance the performance of the node Q at each GOA unit, to make the outputted waveforms of the node Q of each stage GOA unit of the GOA circuit be consistent.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A GOA circuit, comprising: a plurality of cascaded GOA units, wherein a N-th stage GOA unit controls charging of a N-th horizontal scanning line, the N-th stage GOA unit comprises a pull-high control circuit, a pull-high circuit, a pull-down circuit, a pull-down sustain circuit, and a boast capacitor; the pull-high circuit, the pull-down sustain circuit and the boast capacitor are respectively connected with a node and a gate signal output terminal of the N-th stage GOA circuit, a first clock signal of the N-th stage GOA unit is inputted to the pull-high circuit, a stage-transfer signal output terminal of the N-th stage GOA unit being connected with the pull-high circuit and the pull-down circuit is respectively connected with the node of the N-th stage GOA circuit; the pull-high control circuit comprises:

a first thin film transistor, a gate electrode of first thin film transistor being connected with a stage-transfer signal output terminal of the (N−m)th stage GOA unit, m is a natural number, a source electrode and a drain electrode of first thin film transistor being respectively connected with a gate electrode of a second thin film transistor and inputted with a second clock signal of the N-th stage GOA unit;

a source electrode and a drain electrode of the second thin film transistor being respectively connected with the stage-transfer signal output terminal of the (N−m)th stage GOA unit and the node of the N-th stage GOA unit;

wherein the gate electrode of first thin film transistor is connected with a stage-transfer signal output terminal of the (N−4)th stage GOA unit, the source electrode and the drain electrode of the second thin film transistor are respectively connected with the stage-transfer signal output terminal of the (N−4)th stage GOA unit and the node of the N-th stage GOA unit.

2. The GOA circuit according to claim 1, wherein a start signal is inputted to the stage-transfer signal output terminal of the (N−m)th stage GOA unit of preceding m-th GOA unit.

3. The GOA circuit according to claim 1, wherein a start signal is inputted to the stage-transfer signal output terminal of the (N−4)th stage GOA unit of preceding 4 stage GOA units.

4. The GOA circuit according to claim 1, wherein the GOA circuit comprises eight first clock signals with the same waveform and different initial phases.

5. The GOA circuit according to claim 4, wherein the initial phases of each adjacent two of the eight first clock signals are arranged with an equivalent phase difference of $\frac{1}{4}\pi$.

6. The GOA circuit according to claim 1, wherein the GOA circuit comprises two or at least two first clock signals with the same waveform and different initial phases.

7. The GOA circuit according to claim 1, wherein the GOA circuit is manufactured based on amorphous silicon thin film transistor fabrication.

8. The GOA circuit according to claim 1, wherein the pull-high circuit comprises:

a third thin film transistor, a gate electrode is connected with the node of the N-th stage GOA unit, a source electrode and a drain electrode are respectively connected with the gate signal output terminal of the N-th stage GOA unit and inputted with the first clock signal;

a fourth thin film transistor, a gate electrode is connected with the node of the N-th order GOA unit, a source electrode and a drain electrode are respectively connected with the stage-transfer signal output terminal of the N-th stage GOA unit and inputted with the first clock signal.

9. A liquid crystal display device, comprising the GOA circuit according to claim 1.

10. A GOA circuit, comprising: a plurality of cascaded GOA units, wherein a N-th stage GOA unit controls charging of a N-th horizontal scanning line, the N-th stage GOA unit comprises a pull-high control circuit, a pull-high circuit, a pull-down circuit, a pull-down sustain circuit, and a boast capacitor; the pull-high circuit, the pull-down sustain circuit and the boast capacitor are respectively connected with a node and a gate signal output terminal of the N-th stage GOA circuit, a first clock signal of the N-th stage GOA unit is inputted to the pull-high circuit, a stage-transfer signal output terminal of the N-th stage GOA unit being connected with the pull-high circuit and the pull-down circuit is respectively connected with the node of the N-th stage GOA circuit; the pull-high control circuit comprises:

a first thin film transistor, a gate electrode of first thin film transistor being connected with a stage-transfer signal output terminal of the (N−m)th stage GOA unit, m is a natural number, a source electrode and a drain electrode of first thin film transistor being respectively connected with a gate electrode of a second thin film transistor and inputted with a second clock signal of the N-th stage GOA unit;

a source electrode and a drain electrode of the second thin film transistor being respectively connected with the stage-transfer signal output terminal of the (N−m)th stage GOA unit and the node of the N-th stage GOA unit;

wherein a start signal is inputted to the stage-transfer signal output terminal of the (N−m)th stage GOA unit of preceding m-th GOA unit;

wherein the GOA circuit comprises two or at least two first clock signals with the same waveform and different initial phases;

wherein the GOA circuit is manufactured based on amorphous silicon thin film transistor fabrication;

wherein the pull-high circuit comprises:

a third thin film transistor, a gate electrode is connected with the node of the N-th stage GOA unit, a source electrode and a drain electrode are respectively connected with the gate signal output terminal of the N-th stage GOA unit and inputted with the first clock signal;

a fourth thin film transistor, a gate electrode is connected with the node of the N-th order GOA unit, a source electrode and a drain electrode are respectively connected with the stage-transfer signal output terminal of the N-th stage GOA unit and inputted with the first clock signal.

11. The GOA circuit according to claim 10, wherein the gate electrode of first thin film transistor is connected with a stage-transfer signal output terminal of the (N−4)th stage GOA unit, the source electrode and the drain electrode of the second thin film transistor are respectively connected with the stage-transfer signal output terminal of the (N−4)th stage GOA unit and the node of the N-th stage GOA unit.

12. The GOA circuit according to claim 11, wherein a start signal is inputted to the stage-transfer signal output terminal of the (N−4)th stage GOA unit of preceding four stage GOA units.

13. The GOA circuit according to claim 11, wherein the GOA circuit comprises eight first clock signals with the same waveform and different initial phases.

14. The GOA circuit according to claim 13, wherein the initial phases of each adjacent two of the eight first clock signals are arranged with an equivalent phase difference of $\frac{1}{4}\pi$.

* * * * *